(12) United States Patent
Chin et al.

(10) Patent No.: US 9,031,685 B2
(45) Date of Patent: *May 12, 2015

(54) ATOMIC LAYER DEPOSITION APPARATUS

(71) Applicant: Applied Materials, Inc., Santa Clara, CA (US)

(72) Inventors: Barry L. Chin, Saratoga, CA (US); Alfred W. Mak, Union City, CA (US); Lawrence C. Lei, Milpitas, CA (US); Ming Xi, Sunnyvale, CA (US); Hua Chung, San Jose, CA (US); Ken Kaung Lai, San Jose, CA (US); Jeong Soo Byun, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/149,560

(22) Filed: Jan. 7, 2014

(65) Prior Publication Data
US 2014/0130739 A1    May 15, 2014

Related U.S. Application Data

(63) Continuation of application No. 13/235,855, filed on Sep. 19, 2011, now Pat. No. 8,626,330, which is a continuation of application No. 12/953,220, filed on Nov. 23, 2010, now Pat. No. 8,027,746, which is a (Continued)

(51) Int. Cl.
*G06F 19/00* (2011.01)
*C23C 16/455* (2006.01)
*C23C 16/458* (2006.01)

(52) U.S. Cl.
CPC ..... *C23C 16/45544* (2013.01); *C23C 16/45548* (2013.01); *C23C 16/45525* (2013.01); *C23C 16/45551* (2013.01); *C23C 16/4583* (2013.01)

(58) Field of Classification Search
CPC ............ C23C 16/4583; C23C 16/45525; C23C 16/45551; C23C 16/45548
USPC .............. 700/120, 121, 123; 118/719
See application file for complete search history.

(56) References Cited

U.S. PATENT DOCUMENTS

| 4,058,430 A | 11/1977 | Suntola et al. |
| 4,389,973 A | 6/1983 | Suntola et al. |

(Continued)

FOREIGN PATENT DOCUMENTS

| DE | 103 28 578 A1 | 2/2004 |
| EP | 0381109 A2 | 8/1990 |

(Continued)

OTHER PUBLICATIONS

Liu, et al., "Generating Sub-30nm Poly-Silicon Gates Using PECVD Amorphous Carbon as Hardmask and Anti-Reflective Coating", Proceedings of SPIE, Optical Microlithography XVI, vol. 5040, No. 1, Feb. 25, 2003, pp. 841-848.

(Continued)

*Primary Examiner* — Michael D Masinick
(74) *Attorney, Agent, or Firm* — Patterson & Sheridan, LLP

(57) ABSTRACT

A method and apparatus for atomic layer deposition (ALD) is described. In one embodiment, an apparatus comprises a vacuum chamber body having a contiguous internal volume comprised of a first deposition region spaced-apart from a second deposition region, the chamber body having a feature operable to minimize intermixing of gases between the first and the second deposition regions, a first gas port formed in the chamber body and positioned to pulse gas preferentially to the first deposition region to enable a first deposition process to be performed in the first deposition region, and a second gas port formed in the chamber body and positioned to pulse gas preferentially to the second deposition region to enable a second deposition process to be performed in the second deposition region is provided.

19 Claims, 4 Drawing Sheets

Related U.S. Application Data continuation of application No. 12/646,706, filed on Dec. 23, 2009, now Pat. No. 7,860,597, which is a continuation of application No. 11/423,535, filed on Jun. 12, 2006, now Pat. No. 7,660,644, which is a continuation of application No. 09/917,842, filed on Jul. 27, 2001, now Pat. No. 7,085,616.

(56) References Cited

U.S. PATENT DOCUMENTS

| | | |
|---|---|---|
| 4,413,022 A | 11/1983 | Suntola et al. |
| 4,423,701 A | 1/1984 | Nath et al. |
| 4,664,939 A | 5/1987 | Ovshinsky |
| 4,834,831 A | 5/1989 | Nishizawa et al. |
| 4,975,144 A | 12/1990 | Yamazaki et al. |
| 4,975,252 A | 12/1990 | Nishizawa et al. |
| 4,993,357 A | 2/1991 | Scholz et al. |
| 5,022,959 A | 6/1991 | Itoh et al. |
| 5,225,368 A | 7/1993 | Dodson |
| 5,261,959 A | 11/1993 | Gasworth |
| 5,262,262 A | 11/1993 | Yagi et al. |
| 5,281,274 A | 1/1994 | Yoder |
| 5,294,286 A | 3/1994 | Nishizawa et al. |
| 5,338,362 A | 8/1994 | Imahashi et al. |
| 5,374,570 A | 12/1994 | Nasu et al. |
| 5,441,703 A | 8/1995 | Jurgensen et al. |
| 5,443,647 A | 8/1995 | Aucoin et al. |
| 5,461,003 A | 10/1995 | Havemann et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,518,542 A | 5/1996 | Matsukawa et al. |
| 5,592,581 A | 1/1997 | Okase |
| 5,674,573 A | 10/1997 | Mitani et al. |
| 5,674,786 A | 10/1997 | Turner et al. |
| 5,711,811 A | 1/1998 | Suntola et al. |
| 5,730,802 A | 3/1998 | Ishizumi et al. |
| 5,759,913 A | 6/1998 | Fulford, Jr. et al. |
| 5,789,320 A | 8/1998 | Andricacos et al. |
| 5,796,116 A | 8/1998 | Nakata et al. |
| 5,807,792 A | 9/1998 | Ilg et al. |
| 5,830,332 A | 11/1998 | Babich et al. |
| 5,835,677 A | 11/1998 | Li et al. |
| 5,855,680 A | 1/1999 | Soininen et al. |
| 5,866,920 A | 2/1999 | Matsumoto et al. |
| 5,879,459 A | 3/1999 | Gadgil et al. |
| 5,882,830 A | 3/1999 | Visser et al. |
| 5,900,288 A | 5/1999 | Kuhman et al. |
| 5,916,365 A | 6/1999 | Sherman |
| 5,930,655 A | 7/1999 | Cooney, III et al. |
| 5,981,000 A | 11/1999 | Grill et al. |
| 5,986,344 A | 11/1999 | Subramanion et al. |
| 5,998,100 A | 12/1999 | Azuma et al. |
| 6,008,140 A | 12/1999 | Ye et al. |
| 6,015,590 A | 1/2000 | Suntola et al. |
| 6,030,901 A | 2/2000 | Hopper et al. |
| 6,035,803 A | 3/2000 | Robles et al. |
| 6,042,652 A | 3/2000 | Hyun et al. |
| 6,043,167 A | 3/2000 | Lee et al. |
| 6,054,379 A | 4/2000 | Yau et al. |
| 6,057,226 A | 5/2000 | Wong |
| 6,064,118 A | 5/2000 | Sasaki |
| 6,066,577 A | 5/2000 | Cooney, III et al. |
| 6,080,529 A | 6/2000 | Ye et al. |
| 6,098,568 A | 8/2000 | Raoux et al. |
| 6,139,700 A | 10/2000 | Kang et al. |
| 6,140,224 A | 10/2000 | Lin |
| 6,140,226 A | 10/2000 | Grill et al. |
| 6,143,476 A | 11/2000 | Ye et al. |
| 6,153,935 A | 11/2000 | Edelstein et al. |
| 6,165,890 A | 12/2000 | Kohl et al. |
| 6,174,377 B1 | 1/2001 | Doering et al. |
| 6,183,563 B1 | 2/2001 | Choi et al. |
| 6,183,930 B1 | 2/2001 | Ueda et al. |
| 6,184,572 B1 | 2/2001 | Mountsier et al. |
| 6,197,683 B1 | 3/2001 | Kang et al. |
| 6,200,893 B1 | 3/2001 | Sneh |
| 6,203,898 B1 | 3/2001 | Kohler et al. |
| 6,211,065 B1 | 4/2001 | Xi et al. |
| 6,214,637 B1 | 4/2001 | Kim et al. |
| 6,214,730 B1 | 4/2001 | Cooney, III et al. |
| 6,231,672 B1 | 5/2001 | Choi et al. |
| 6,235,629 B1 | 5/2001 | Takenaka |
| 6,270,572 B1 | 8/2001 | Kim et al. |
| 6,291,334 B1 | 9/2001 | Somekh |
| 6,305,314 B1 | 10/2001 | Sneh et al. |
| 6,306,216 B1 | 10/2001 | Kim et al. |
| 6,316,347 B1 | 11/2001 | Chang et al. |
| 6,323,119 B1 | 11/2001 | Xi et al. |
| 6,331,380 B1 | 12/2001 | Ye et al. |
| 6,333,255 B1 | 12/2001 | Sekiguchi |
| 6,352,922 B1 | 3/2002 | Kim |
| 6,365,025 B1 | 4/2002 | Ting et al. |
| 6,387,185 B2 | 5/2002 | Doering et al. |
| 6,447,607 B2 | 9/2002 | Soininen et al. |
| 6,478,872 B1 | 11/2002 | Chae et al. |
| 6,481,945 B1 | 11/2002 | Hasper et al. |
| 6,497,767 B1 | 12/2002 | Okase et al. |
| 6,511,539 B1 | 1/2003 | Raaijmakers |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,630,030 B1 | 10/2003 | Suntola et al. |
| 6,630,201 B2 | 10/2003 | Chiang et al. |
| 6,653,735 B1 | 11/2003 | Yang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,812,157 B1 | 11/2004 | Gadgil |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 6,884,733 B1 | 4/2005 | Dakshina-Murthy et al. |
| 7,064,724 B2 | 6/2006 | Louzir et al. |
| 7,079,740 B2 | 7/2006 | Vandroux et al. |
| 7,085,616 B2 | 8/2006 | Chin et al. |
| 7,660,644 B2 | 2/2010 | Chin et al. |
| 7,860,597 B2 | 12/2010 | Chin et al. |
| 8,027,746 B2 | 9/2011 | Chin et al. |
| 8,626,330 B2 | 1/2014 | Chin et al. |
| 2001/0007788 A1 | 7/2001 | Chang et al. |
| 2001/0013312 A1 | 8/2001 | Soininen et al. |
| 2001/0014371 A1 | 8/2001 | Kilpi |
| 2001/0042523 A1 | 11/2001 | Kesala |
| 2001/0054377 A1 | 12/2001 | Lindfors et al. |
| 2002/0000196 A1 | 1/2002 | Park |
| 2002/0001778 A1 | 1/2002 | Latchford et al. |
| 2002/0007790 A1 | 1/2002 | Park |
| 2002/0009544 A1 | 1/2002 | McFeely et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0086547 A1 | 7/2002 | Mui et al. |
| 2002/0090794 A1 | 7/2002 | Chang et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors |
| 2002/0121241 A1 | 9/2002 | Nguyen et al. |
| 2002/0121342 A1 | 9/2002 | Nguyen et al. |
| 2002/0127745 A1 | 9/2002 | Lu et al. |
| 2002/0134307 A1 | 9/2002 | Choi |

(56) References Cited

U.S. PATENT DOCUMENTS

| | | |
|---|---|---|
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2003/0010451 A1 | 1/2003 | Tzu et al. |
| 2003/0022338 A1 | 1/2003 | Ruben et al. |
| 2003/0042630 A1 | 3/2003 | Babcoke et al. |
| 2003/0053799 A1 | 3/2003 | Lei |
| 2003/0057527 A1 | 3/2003 | Chung et al. |
| 2003/0072913 A1 | 4/2003 | Chou et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0091938 A1 | 5/2003 | Fairbairn et al. |
| 2003/0101927 A1 | 6/2003 | Raaijmakers |
| 2003/0106490 A1 | 6/2003 | Jallepally et al. |
| 2003/0113187 A1 | 6/2003 | Lei et al. |
| 2003/0116087 A1 | 6/2003 | Nguyen et al. |
| 2003/0119307 A1 | 6/2003 | Bekiaris et al. |
| 2003/0121489 A1 | 7/2003 | Rotter et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1 | 9/2003 | Thakur et al. |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0221780 A1 | 12/2003 | Lei et al. |
| 2003/0224107 A1 | 12/2003 | Lindfors et al. |
| 2003/0224723 A1 | 12/2003 | Sun et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0023502 A1 | 2/2004 | Tzou et al. |
| 2004/0025370 A1 | 2/2004 | Guenther |
| 2004/0038537 A1 | 2/2004 | Liu et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |
| 2004/0166691 A1 | 8/2004 | Nieh et al. |
| 2004/0180551 A1 | 9/2004 | Biles et al. |
| 2004/0229470 A1 | 11/2004 | Rui et al. |
| 2005/0006799 A1 | 1/2005 | Gregg et al. |
| 2005/0019585 A1 | 1/2005 | Kashiwagi et al. |
| 2005/0202683 A1 | 9/2005 | Wang et al. |
| 2005/0287771 A1 | 12/2005 | Seamons et al. |

FOREIGN PATENT DOCUMENTS

| | | |
|---|---|---|
| EP | 901156 A2 | 3/1999 |
| EP | 1167569 A1 | 1/2002 |
| JP | 58098917 | 6/1983 |
| JP | 04291916 A | 10/1992 |
| JP | 05047668 | 2/1993 |
| JP | 05206036 | 8/1993 |
| JP | 05234899 | 9/1993 |
| JP | 05270987 A | 10/1993 |
| JP | 06224138 | 8/1994 |
| JP | 0945633 A | 2/1997 |
| JP | 11026578 A | 1/1999 |
| JP | 2000212752 | 8/2000 |
| JP | 2000319772 | 11/2000 |
| JP | 2001020075 | 1/2001 |
| WO | WO-9617107 A1 | 6/1996 |
| WO | WO-9901595 A1 | 1/1999 |
| WO | WO-9965064 A1 | 12/1999 |
| WO | WO-00/05763 A1 | 2/2000 |
| WO | WO-0054320 | 9/2000 |
| WO | WO-0079576 | 12/2000 |
| WO | WO-0117692 A1 | 3/2001 |
| WO | WO-0136702 A1 | 5/2001 |
| WO | WO-0208488 A1 | 1/2002 |
| WO | WO-0245871 A1 | 6/2002 |
| WO | WO-03023835 | 3/2003 |

OTHER PUBLICATIONS

International Search Report for International Application No. PCT/US05/008070 dated May 31, 2005.

Written Opinion for International Application No. PCT/US05/008070 dated May 31, 2005.

International Search Report for International Application No. PCT/US05/005855 dated Oct. 13, 2005.

Written Opinion for International Application No. PCT/US05/005855 dated Oct. 13, 2005.

ATOMIC LAYER DEPOSITION APPARATUS

CROSS-REFERENCE TO RELATED APPLICATIONS

This application is a continuation of U.S. patent application Ser. No. 13/235,855, filed Sep. 19, 2011, which is a continuation of U.S. patent application Ser. No. 12/953,220, filed Nov. 23, 2010, now issued as U.S. Pat. No. 8,027,746, which is a continuation of U.S. patent application Ser. No. 12/646,706, filed Dec. 23, 2009, now issued as U.S. Pat. No. 7,860,597, which is a continuation of U.S. patent application Ser. No. 11/423,535, filed Jun. 12, 2006, now issued as U.S. Pat. No. 7,660,644, which is a continuation of U.S. patent application Ser. No. 09/917,842, filed Jul. 27, 2001, now issued as U.S. Pat. No. 7,085,616, all of which are hereby incorporated by reference in their entireties.

BACKGROUND OF THE INVENTION

1. Field of the Invention

The present invention relates to integrated circuit processing equipment and, more particularly to atomic layer deposition (ALD) equipment.

2. Description of the Background Art

Semiconductor wafer processing systems that perform atomic layer deposition (ALD) are used to form material layers on high aspect ratio structures. Referring to FIG. 1, ALD systems typically comprise a deposition chamber 10, a gas supply system 12, and a gas exhaust system 14. The deposition chamber includes a pedestal 11 that is used to support a substrate 13 such as a semiconductor wafer. The gas supply system 12 is used to provide reaction gases to the deposition chamber 10, and the gas exhaust system 14 is used to remove reaction gases from the deposition chamber 10.

In ALD processes, a material layer is formed on a substrate by sequentially chemisorbing alternating monolayers of two or more compounds thereon. Each of the alternating monolayers is chemisorbed onto the substrate by providing a different deposition gas to the chamber that comprises one of the two or more compounds used to form the material layer. After each monolayer is chemisorbed on the substrate, a purge gas is introduced into the deposition chamber to flush the deposition gas therefrom.

Since each of the alternating monolayers of the two or more compounds used to form the material layer is chemisorbed onto the substrate by providing a different deposition gas to the chamber followed by a purge gas, atomic layer deposition (ALD) processes are time consuming. As such, integrated circuit fabrication using ALD processes are costly due to decreased wafer throughput.

Therefore, a need exists in the art for atomic layer deposition (ALD) systems for integrated circuit fabrication.

SUMMARY OF THE INVENTION

A method and apparatus for atomic layer deposition (ALD) is described. In one embodiment, an apparatus comprises a vacuum chamber body having a contiguous internal volume comprised of a first deposition region spaced-apart from a second deposition region, the chamber body having a feature operable to minimize intermixing of gases between the first and the second deposition regions, a first gas port formed in the chamber body and positioned to pulse gas preferentially to the first deposition region to enable a first deposition process to be performed in the first deposition region, and a second gas port formed in the chamber body and positioned to pulse gas preferentially to the second deposition region to enable a second deposition process to be performed in the second deposition region is provided.

The atomic layer deposition (ALD) apparatus is compatible with integrated circuit fabrication processes. In one integrated circuit fabrication process, a substrate is positioned on a wafer support in an ALD apparatus comprising two or more integrally connected deposition regions. The wafer support with the substrate thereon is then moved into a first one of the integrally connected deposition regions wherein a first monolayer of a first compound is formed on the surface thereof. After the first monolayer of the first compound of formed on the surface of the substrate the wafer support is moved to a second one of the integrally connected deposition regions wherein a second monolayer of a second compound is formed on the first monolayer of the first compound. Thereafter, alternate monolayers of the first and second compounds are deposited one over the other by moving the wafer support with the substrate thereon between the two or more integrally connected deposition regions until a material layer having a desired thickness is formed on the substrate.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
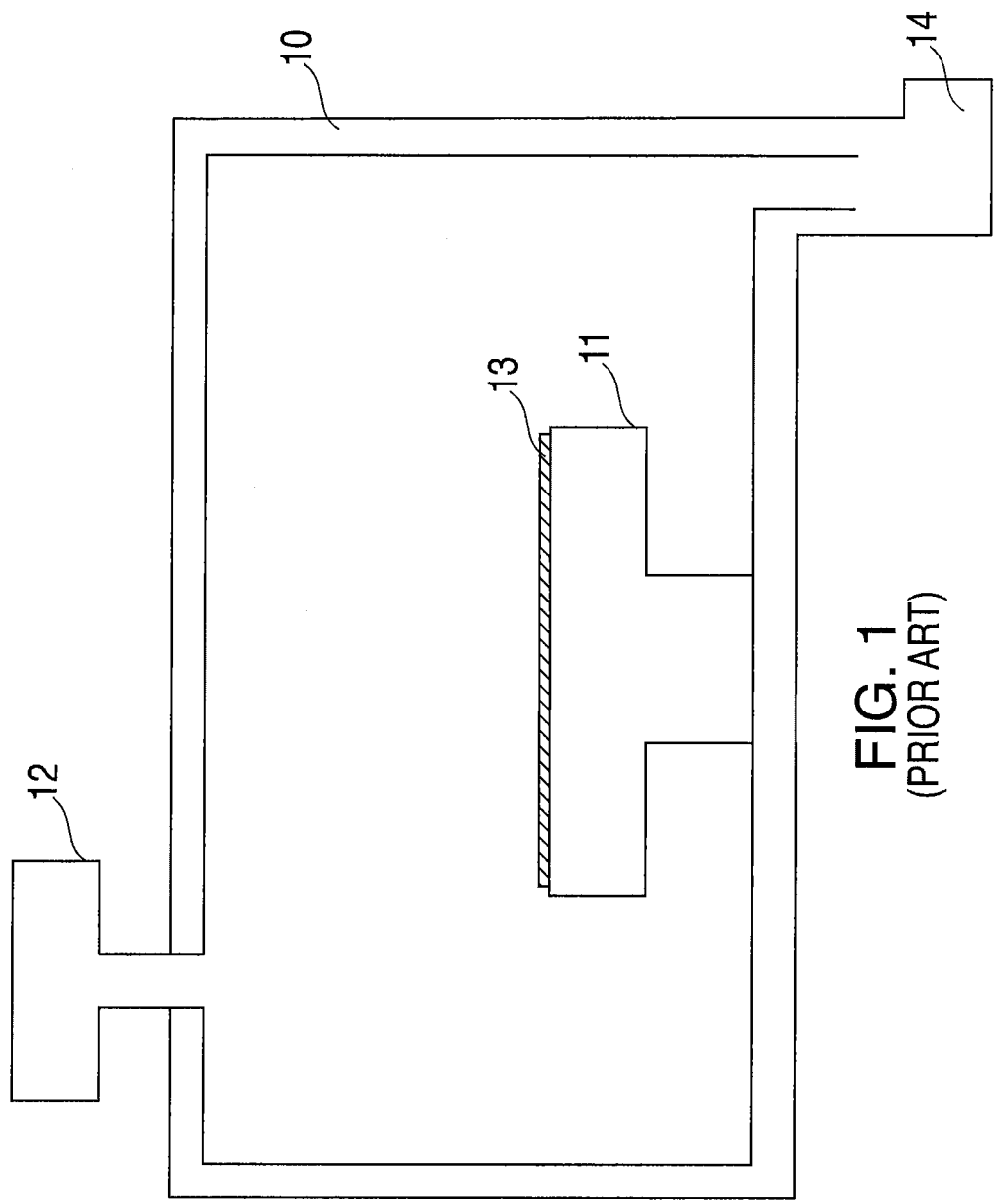
FIG. 1 is a schematic diagram of a prior art atomic layer deposition (ALD) apparatus.
Figure 2:
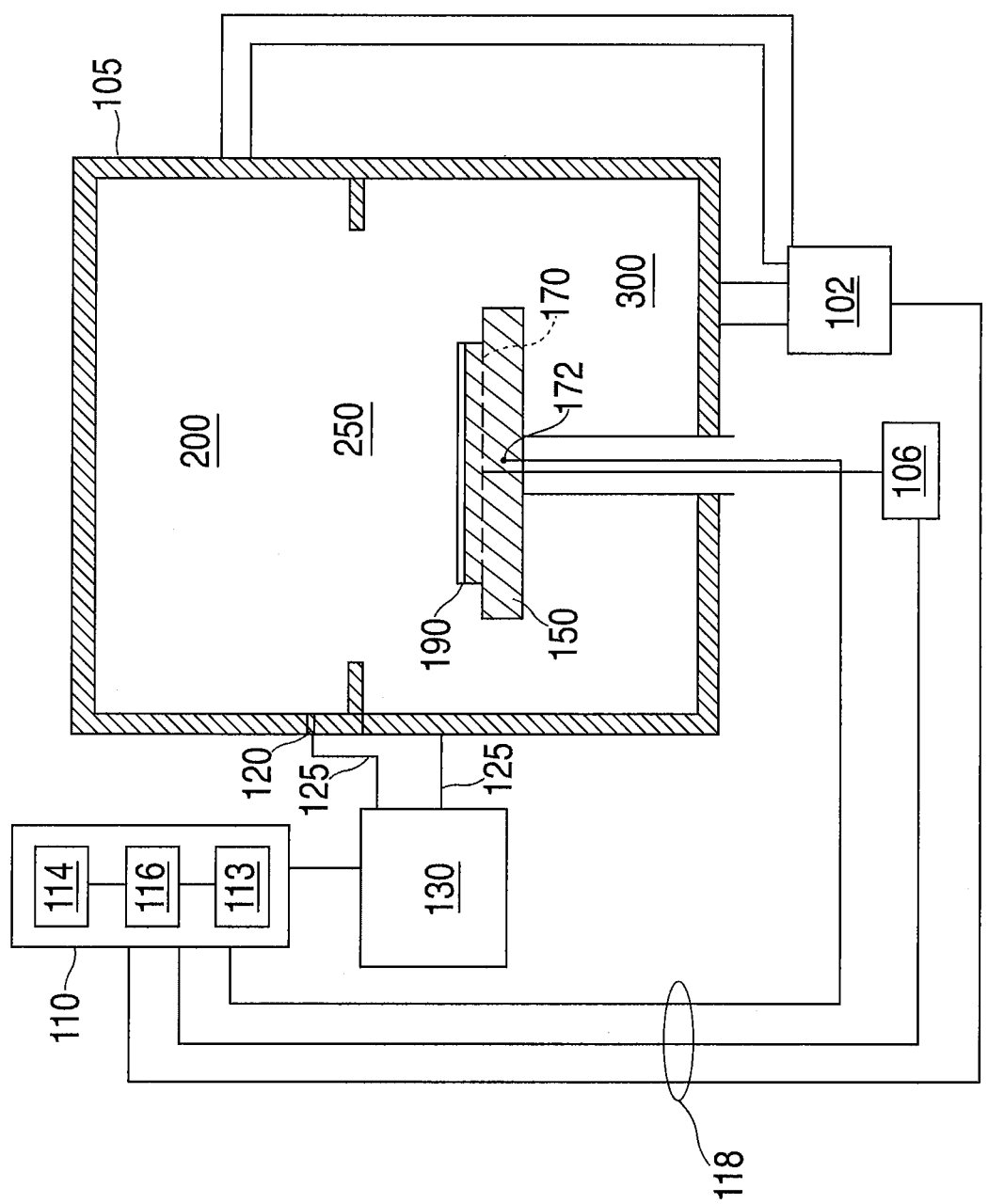
FIG. 2 is a schematic diagram of an atomic layer deposition (ALD) apparatus that can be used for the practice of embodiments described herein.

FIG. 2 is perspective view of an atomic layer deposition (ALD) apparatus 100 that can be used to form a material layer on a semiconductor substrate in accordance with embodiments described herein. The ALD apparatus 100 comprises a deposition chamber 105, a gas panel 130, a control unit 110, along with other hardware components such as power supplies 106 and vacuum pumps 102.

The deposition chamber 105 comprises two or more deposition regions 200, 300 that are integrally connected to each other. In FIG. 2 the two or more deposition regions 200, 300 are configured as one above the other in a vertical arrangement, however it is contemplated that the two or more deposition regions may also be configured in a side by side horizontal arrangement (not shown).

The two or more deposition regions 200, 300 are integrally connected one to another with an aperture 250. The aperture 250 is of a sufficient size to permit the passage therethrough of a wafer support 150 having a substrate thereon.

The aperture 250 is optionally sealed. The aperture is sealed to minimize the intermixing of deposition gases within the two or more deposition regions 200, 300. Physical and/or pressure differences may be used.

Alternatively, an inert gas flow may be used to minimize the intermixing of deposition gases at the aperture 250 between the two or more deposition regions 200, 300. The inert gas flow provides a laminar flow around the area of the aperture 250. The inert gas flow is provided around the area of the aperture 250 through orifices (not shown).

The process chamber 105 houses a wafer support 150, which is used to support a substrate such as a semiconductor wafer 190. The wafer support 150 is moveable inside the chamber 105 between the integrally connected deposition regions 200, 300 using a displacement mechanism (not shown).

Depending on the specific process, the semiconductor wafer 190 can be heated to some desired temperature prior to material layer deposition. For example, wafer support 150 may be heated by an embedded heater element 170. The wafer support 150 may be resistively heated by applying an electric current from an AC power supply 106 to the heater element 170. The wafer 190 is, in turn, heated by the wafer support 190.

A temperature sensor 172, such as a thermocouple, may also be embedded in the wafer support 150 to monitor the temperature of the support in a conventional manner. The measured temperature can be used in a feedback loop to control the power supplied to the heater element 170, such that the wafer temperature can be maintained or controlled at a desired temperature which is suitable for the particular process application. The pedestal may optionally be heated using radiant heat (not shown).

A vacuum pump 102 is used to evacuate each of the deposition regions 200, 300 of the process chamber 105 and to maintain the proper gas flows and pressure inside the chamber 105. Orifices 120 provide process gases to each of the one or more deposition regions 200, 300. Each orifice 120 is connected to a gas panel 130 via a gas line 125, which controls and supplies various gases used in different steps of the deposition sequence.

Proper control and regulation of the gas flows through the gas panel 130 is performed by mass flow controllers (not shown) and the control unit 110. Illustratively, the control unit 110 comprises a central processing unit (CPU) 113, as well as support circuitry 114, and memories containing associated control software 116. The control unit 110 is responsible for automated control of the numerous steps required for wafer processing—such as movement of the wafer support, gas flow control, temperature control, chamber evacuation, and other steps. Bi-directional communications between the control unit 110 and the various components of the ALD 100 are handled through numerous signal cables collectively referred to as signal buses 118, some of which are illustrated in FIG. 2.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Figure 3:
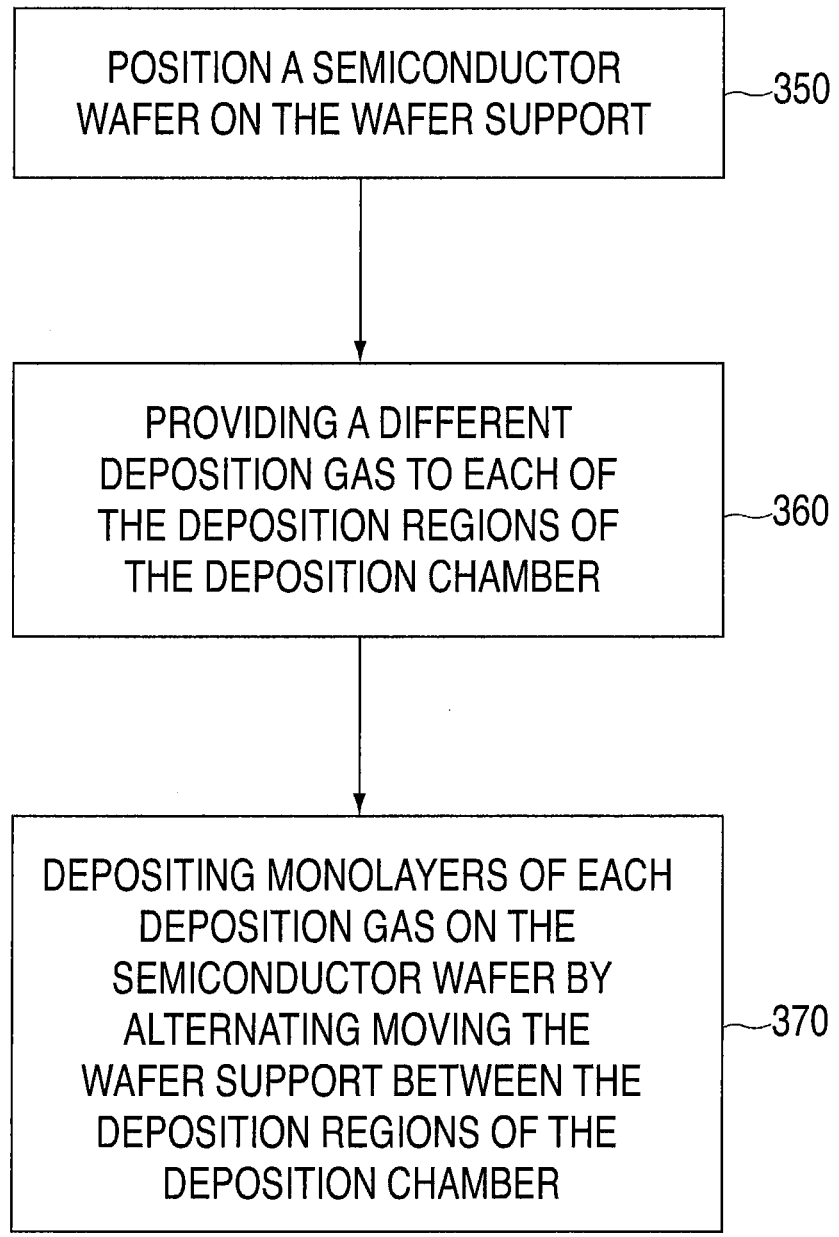
FIG. 3 is a flow diagram of a process sequence for the atomic layer deposition (ALD) apparatus of FIG. 2.

Referring to FIG. 3, the ALD process sequence begins when a semiconductor wafer is positioned on the wafer support in one of the two or more deposition regions 200, 300 of the deposition chamber 105, as indicated in step 350.

After the semiconductor wafer is positioned on the wafer support, a deposition gas is provided to each of the two or more deposition regions 200, 300, as indicated in step 360 of FIG. 3. A different deposition gas is provided to each of the two or more deposition regions 200, 300. The deposition gases may each be provided using a continuous flow, or optionally using a pulsed flow.

Thereafter as indicated in step 370 of FIG. 3, alternating monolayers of each deposition gas are chemisorbed onto the surface of the semiconductor wafer to form a material layer having a desired thickness thereon. Each monolayer is chemisorbed onto the surface of the semiconductor wafer as the wafer support is alternately moved between the two or more deposition regions through aperture 250.

Figure 4:
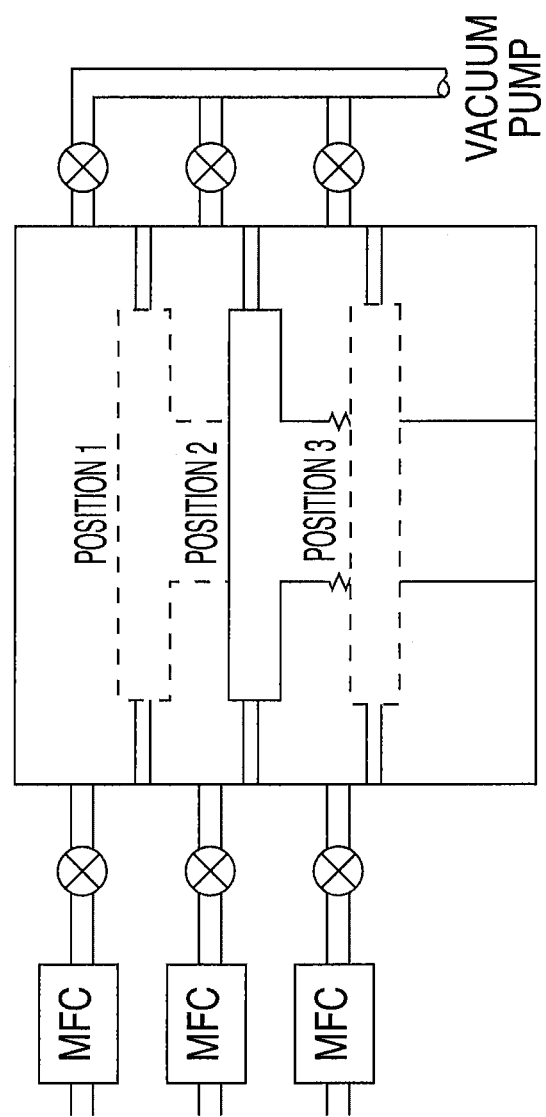
FIG. 4 is a schematic diagram of a second embodiment of an atomic layer deposition (ALD) apparatus that can be used for the practice of embodiments described herein.

Although embodiments described herein refer mainly to an atomic layer deposition chamber having two deposition regions, those skilled in the art will appreciate that, as described, embodiments of the present invention will also encompass deposition chambers having more than two deposition regions. For example, FIG. 4 is a schematic diagram of an ALD apparatus in which a wafer support is capable of movement between more than two positions (Position 1, Position 2 and Position 3) to transport wafers between a plurality of deposition regions within the chamber. Thus while the foregoing is directed to the preferred embodiment of the present invention, other and further embodiments of the invention may be devised without departing from the basic scope thereof, and the scope thereof is determined by the claims which follow.

What is claimed is:

1. An apparatus comprising:
    a vacuum chamber body having a contiguous internal volume comprised of a first deposition region spaced-apart from a second deposition region, the chamber body having a feature operable to minimize intermixing of gases between the first and the second deposition regions;
    a first gas port formed in the chamber body and positioned to pulse gas preferentially to the first deposition region to enable a first deposition process to be performed in the first deposition region; and
    a second gas port formed in the chamber body and positioned to pulse gas preferentially to the second deposition region to enable a second deposition process to be performed in the second deposition region, wherein the feature operable to minimize intermixing of gases between the first deposition region and the second deposition region comprises an inert gas flow.

2. The apparatus of claim 1, further comprising:
    a means for moving a substrate disposed in the internal volume of the chamber body between a first position in the first deposition region adjacent the first gas port and a second position in the second deposition region adjacent the second gas port.

3. The apparatus of claim 2, wherein the substrate is a semiconductor wafer.

4. The apparatus of claim 1, further comprising:
    a substrate support disposed in the internal volume of the chamber body and movable to a first position in the first deposition region adjacent the first gas port and a second position in the second deposition region adjacent the second gas port.

5. The apparatus of claim 4, wherein a piston coupled to the substrate support moves the substrate support between the first deposition region and the second deposition region.

6. The apparatus of claim 4, wherein the substrate support is an electrostatic chuck.

7. The apparatus of claim 4, further comprising a heater element embedded in the substrate support, wherein the heater element controls the temperature of a substrate disposed on the substrate support.

8. The apparatus of claim 7, further comprising a thermocouple embedded in the substrate support to monitor the temperature of the substrate support.

9. The apparatus of claim 8, wherein the temperature measured by the thermocouple can be used in a feedback loop to control power supplied to the embedded heater element.

10. The apparatus of claim 1, further comprising:
a heater that controls the temperature of a substrate disposed thereon in each of the first deposition region and the second deposition region of the chamber body.

11. The apparatus of claim 1, wherein the first deposition region is integrally connected to the second deposition region with an aperture.

12. The apparatus of claim 11, wherein the aperture is of sufficient size to permit the passage therethrough of a substrate support having a substrate thereon.

13. The apparatus of claim 11, wherein the inert gas flow provides a laminar flow around the area of the aperture.

14. The apparatus of claim 13, wherein the inert gas flow is provided around the area of the aperture through orifices.

15. The apparatus of claim 1, further comprising a gas exhaust pump coupled to the chamber body.

16. The apparatus of claim 1, wherein the chamber body has at least one sidewall shared by the first deposition region and the second deposition region.

17. The apparatus of claim 16, wherein the chamber body further comprises:
a bottom coupled to the sidewalls having the substrate support extending therefrom.

18. The apparatus of claim 16, further comprising:
a gas supply panel coupled with the vacuum chamber body, wherein the gas supply panel includes separate gas supply lines coupled with the first gas port and the second gas port.

19. The apparatus of claim 1, wherein the first deposition region and the second deposition region are arranged vertically.

* * * * *